United States Patent [19]
Allen et al.

[11] Patent Number: 6,037,967
[45] Date of Patent: Mar. 14, 2000

[54] SHORT WAVELENGTH PULSED LASER SCANNER

[75] Inventors: Paul C. Allen, Beaverton; Eugene Mirro, Portland, both of Oreg.

[73] Assignee: Etec Systems, Inc., Hayward, Calif.

[21] Appl. No.: 08/769,169

[22] Filed: Dec. 18, 1996

[51] Int. Cl.[7] ................................................. B41J 2/435
[52] U.S. Cl. .................... 347/255; 347/256; 347/260; 347/261; 347/239
[58] Field of Search ................................. 347/250, 251, 347/252, 255, 261, 237, 239, 260; 355/53; 250/458.1

[56] References Cited

U.S. PATENT DOCUMENTS

| | | | |
|---|---|---|---|
| 4,044,363 | 8/1977 | Morgan | 347/260 |
| 4,180,822 | 12/1979 | Hudson et al. | 347/250 |
| 4,205,348 | 5/1980 | DeBenedictis et al. | 358/481 |
| 4,213,158 | 7/1980 | DeBenedictis | 347/255 |
| 4,307,409 | 12/1981 | Greenig et al. | 347/250 |
| 4,321,564 | 3/1982 | Tregay | 359/320 |
| 4,819,033 | 4/1989 | Yoshitake et al. | 355/53 |
| 4,883,352 | 11/1989 | Bruning | 353/122 |
| 4,912,487 | 3/1990 | Porter et al. | 346/108 |
| 4,918,462 | 4/1990 | Tomita et al. | 347/237 |
| 4,947,047 | 8/1990 | Muraki | 250/492.2 |
| 4,947,186 | 8/1990 | Calloway et al. | 347/232 |
| 5,041,716 | 8/1991 | Wakabayashi | 219/121.68 |
| 5,255,051 | 10/1993 | Allen | 355/77 |
| 5,264,872 | 11/1993 | Wong | 347/250 |
| 5,311,321 | 5/1994 | Crowley | 348/760 |
| 5,327,338 | 7/1994 | Allen et al. | 346/108 |
| 5,377,212 | 12/1994 | Tatsuno et al. | 372/22 |
| 5,386,221 | 1/1995 | Allen et al. | 347/239 |
| 5,479,238 | 12/1995 | Whitney | 355/53 |
| 5,574,537 | 11/1996 | Ozawa | 355/71 |
| 5,673,134 | 9/1997 | Oka et al. | 359/196 |
| 5,796,112 | 8/1998 | Ichie | 250/458.1 |

FOREIGN PATENT DOCUMENTS

| | | |
|---|---|---|
| 0 173 617 | 3/1986 | European Pat. Off. . |
| 6-235944 | 8/1994 | Japan . |
| WO 94/09989 | 5/1994 | WIPO . |

OTHER PUBLICATIONS

James K. Tison, "Highly accurate pattern generation using acousto–optical deflection", SPIE vol. 1463 Optical/Laser Microlithography IV (1991), pp. 629–637 no month.

Goldberg et al. "Deep–UV generation by frequency quadrupling of a high–power GaAIAs semiconducotor laser", *Optics Letter*, vol. 20, No. 10, pp. 1145–1147 (Jan. 26, 1995).

*Primary Examiner*—N. Le
*Assistant Examiner*—Hai C. Pham
*Attorney, Agent, or Firm*—Skjerven, Morrill, MacPherson, Franklin & Friel LLP; Norman R. Klivans

[57] ABSTRACT

A laser pattern generator for semiconductor mask making or direct writing of features on a semiconductor wafer uses a pulsed laser source to achieve high power and short wavelength (e.g. 263 nm or less) radiation, for writing very small-sized features. The laser pulse frequency is either synchronous or asynchronous to the writing grid of the features being written, in various embodiments.

28 Claims, 9 Drawing Sheets

SHORT WAVELENGTH PULSED LASER SCANNER

BACKGROUND OF THE INVENTION

1. Field of the Invention

This invention relates to laser scanners and especially to a laser scanner using short wavelength laser radiation.

2. Description of the Prior Art

Photolithography is commonly employed to produce repeatable patterns on devices such as integrated circuits, integrated circuit masks, flat panel displays, and printed circuit boards. A conventional photolithography process coats a workpiece with a layer of photoresist and illuminates selected regions of the photoresist with light that changes the properties of the illuminated regions. The photoresist layer is then developed and either the illuminated regions or not-illuminated regions (depending on the type of photoresist) are removed to leave a patterned layer covering portions of the workpiece. The workpiece is then subjected to a process such as etching where the covered portions of the workpiece are protected from the process.

A laser scanner is a photolithographic device which scans one or more focused and spatially modulated laser beams in a series of scan lines covering a layer being patterned. Whether a laser scanner illuminates a region depends on the laser beam's intensity as the beam scans passes the region. The precision of a laser scanner in selecting regions illuminated depends on the accuracy of modulation of the laser beam, the sharpness of the focus of the laser beam, the precision with which the laser beam moves across the layer being patterned, and synchronization between modulation and movement of the laser beam.

A typical scanner includes a laser, a modulator, scan optics, and a precision stage. The laser generates a collimated light beam which in a multi-beam system is split into an array of separate collimated sub-beams. Typically, the laser beam is ultraviolet light of wavelength e.g. 363.8 nm (nanometers), or 325 nm. Modulation of the array of beam changes the intensities of the individual sub-beams independently, typically turning sub-beams on and off; gray-scale (intensity) control can also be employed.

Scan optics, including a rotating reflective polygon or other scanning device and a scan lens, forms an image of the beam or array and sweeps that image across a scan line in an image plane of the scan optics onto the surface of the workpiece to be exposed, which is held on an X-Y stage. The stage precisely moves the workpiece approximately perpendicular to the scan line direction. Movement of the workpiece can be continuous during scanning or may only occur during the dead time between scan lines. As the image sweeps across the scan line, sub-beams in the beam are turned on and off to control which regions within the scan line at the surface of the device are illuminated.

For examples of laser scanners see U.S. Pat. No. 5,255,051, issued Oct. 19, 1993, to Paul C. Allen, U.S. Pat. No. 5,327,338, issued Jul. 5, 1994, to Paul Allen, et al., and U.S. Pat. No. 5,386,221, issued Jan. 31, 1995, to Paul C. Allen, et al., all incorporated herein by reference.

A typical application of such laser scanners is, as described above, for photolithography. Certain semiconductor photolithography applications require formation of very small size features. A demand for higher mask patterning resolution, i.e. equipment for forming the masks typically used to fabricate integrated circuits, requires either higher numerical apertures or shorter wavelengths. Commercially available photolithography equipment has a numerical aperture of the lens system of less than 0.80, approximately the limit of what is practical with light (ultraviolet) wavelengths. Remaining avenues for resolution improvement require use of shorter wavelengths. However, as described above, typical wavelengths used in the prior art are in the 350 nm region. It is not possible simply to obtain a commercially available compact continuous wave laser capable of efficiently operating at shorter wavelengths with powers above approximately 1 Watt. Pulsed solid-state lasers have been demonstrated with powers greater than 1 Watt. Hence, there is a need for photolithography equipment capable of operating with a pulsed short wavelength source for forming very small size features, i.e. features of 300 nm or less in size.

SUMMARY

Laser pattern generation, e.g. for mask making or for direct writing of features for instance on semiconductor wafers, to form devices having a feature size of 300 nm or less requires high resolution imaging, only provided by short wavelength radiation, i.e. about 250 nm or less. There is direct ratio between laser wavelength and feature size; it is difficult to fabricate a feature size substantially smaller than the wavelength of the exposure radiation.

Therefore the present inventors have determined that a laser pattern generator using a pulsed laser, operating at e.g. 355 nm or less instead of a conventional continuous wave laser, allows use of short wavelength laser radiation and hence fabrication of small feature sizes.

The present laser pattern generator employs in one embodiment a laser outputting pulsed coherent light at a wavelength of e.g. 263 nm. The laser is a frequency quadrupled solid state laser. This laser is pulsed at high frequency, providing a stream of laser pulses rather than a continuous output beam. The present laser pattern generator may operate in a synchronous mode, where the pulse rate of the laser is synchronous to the beam placement on the writing grid, i.e. the data which is used to operate the modulator is synchronous to the laser beam pulse rate. In this case, the modulator rise time can be much shorter than the laser pulse.

Another type of laser pattern generator in accordance with this invention is an asynchronous type, in which the pulse rate of the laser is at least as fast as the pixel rate of the data used for writing the pattern, and the phase of the pulse rate of the laser is independent of the phase of the external modulator. The modulation rise time in this case is comparable to or greater than the pixel period of the data being written.

In accordance with a (first) synchronous mode embodiment of this invention, a mode locked laser is used in an otherwise conventional laser scanner of the type commercially available. However, the data defining the pattern to be written, i.e. on, off or gray level data, is delivered synchronously with the laser pulses so that the pixels are either exposed or nonexposed on a fixed writing grid. In a (second) asynchronous mode embodiment, the pulse rate is comparable to or faster than the modulation rate and hence not synchronous to the data defining the pattern.

In order to have an efficient operating laser pattern generator, the laser typically has a pulse rate greater than one MHz in either embodiment. Moreover, the spot size to pixel grid separation is large enough to ensure a smooth image intensity. The laser itself is a mode-locked solid state laser outputting light at e.g. 263 nm. Commercially available laser pattern and generators already operate in the ultraviolet. Hence, their optics which are optimized for somewhat higher e.g. 350 nm wavelengths, are readily reconfigured by routine optical engineering to deal with the shorter present 263 nm wavelength. Of course, the present invention is not limited to a 263 nm laser and is applicable to longer wavelengths and also to shorter wavelengths, to the extent that suitable laser sources are available operating at shorter wavelengths.

It is recognized by the present inventors that shorter laser beam wavelengths, e.g. 200 nm or less, are desirable for defining the smaller feature sizes in the pattern to be written. Hence the present invention is directed to the use of a pulsed laser source in a laser pattern generator without limitation to the wavelength of the laser radiation.

DETAILED DESCRIPTION

Figure 1:
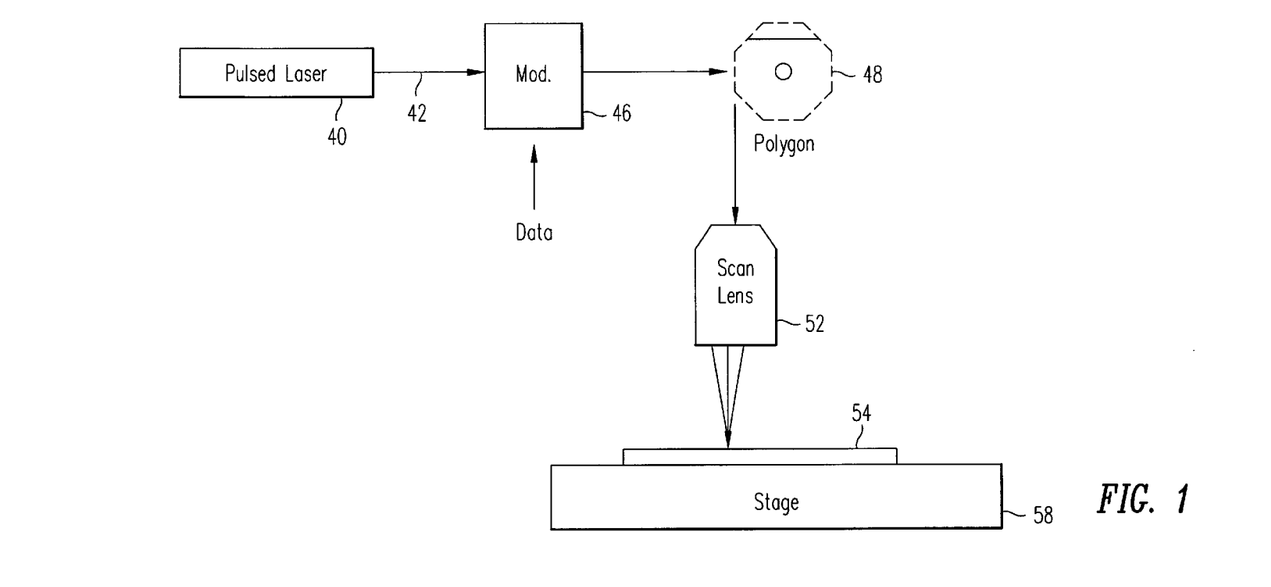
FIG. 1 shows a diagram of a laser scanner in accordance with this invention.

FIG. 1 is a simplified diagram of a laser pattern generator in accordance with this invention. This laser pattern generator, in terms of most of its components, is conventional and generally is of the type described in the above-referenced U.S. patents, and is also similar to a variety of commercially available laser pattern generators as used for photolithography.

However, this laser pattern generator includes, instead of a conventional CW laser, a pulsed laser 40, which emits a series of laser pulses indicated as laser beam 42 which is pulsed at a relatively high frequency, i.e. 100 MHz with a range of typically 1 to 300 MHz. Such a laser can be constructed from a mode-locked Nd:YLF laser driving an external cavity that is resonant for second harmonic radiation. This approach has been described, for instance, in S. C. Tidwell, J. F. Seamans, D. D. Lowenthal, G. Matone and G. Giordano, "Efficient High-Power UV Generation by Use of a Resonant Range Driven by a CW Mode-Locked IR Laser," *Optics Letters* (Sep. 15, 1993). A commercially available model of such a laser is the Antares Nd:YLF model from Coherent, Inc. Adapting such a laser to operate with a resonant cavity is well within the skill of one of ordinary skill in the art. It is to be understood that a pulsed laser is most advantageous at shorter wavelengths, where CW operation at high power levels is not possible. Other advantages of pulsed lasers are their small size and high electrical efficiency. Mode locked diode pumped lasers are under commercial development at 355 and 266 nm.

The pulsed laser beam 42 is coupled to the optical input port of an acousto-optic modulator 46, which also has an electrical port receiving a Data signal as shown. This Data signal represents the pattern to be written. It is to be understood that the laser beam 42 is split into a number of sub-beams and the modulator 46 individually modulates each of the sub-beams, as is well known in this field. The modulated beam output from modulator 46 is incident upon the reflective facets of a conventional rotating polygon 48 of the type well known in this field. This is the actual scanning device and is part of the scanning optics. Other types of scanners may also be used. For instance, see "Highly Accurate Pattern Generation Using Acousto-Optical Deflection" Sanstrom et al., SPIE Vol. 1463 *Optical/Laser Microlithography* (1991), pp. 629 and following, which discloses a laser reticle writer using acousto-optical deflection for scanning. An acousto-optical scanner hence is substitutable for a polygon-type scanner and was found to be faster at short scans. Hence while FIG. 1 shows the rotating polygon scanning device 48, an acousto-optical deflection device or equivalent can be substituted.

The scanning laser beam, reflected from the facets of rotating polygon 48, passes through the scan lens 52 which typically includes refractive (and sometimes reflective) optics which focus the beam on the upper surface of workpiece 54, which in turn is held on stage 58. The workpiece is e.g. a reticle (a transparent substrate on which is formed a layer e.g. of metal to be patterned and over which is also formed a photo-resist layer to be exposed by the scanning beam). Commercially available photo-resists are exposed by an approximately 250 nm wavelength laser beam. Examples of such photo-resists are APEX-E and UV-III from Shipley. Typically the modulator 46 is optimized for the 250 nm wavelength region in terms of transducer geometry and acoustic coupling. Similarly, the refractive elements of the scan lens 52, using conventional fused silica and if necessary, calcium fluoride lens elements, are optimized for the particular incident wavelength. Such modifications are well within the skill of one of ordinary skill in the art. A typical optical output power level of laser 40 is 1 Watt.

While a pulsed laser operating at shorter (sub 250 nm) wavelengths is not now commercially available, research in this area is believed will make such a laser available in the relatively near future. Hence, a system of the type depicted in FIG. 1 operating with a shorter wavelength (e.g. 200 nm or less) pulsed laser also is within the scope of this invention. Of course, accompanying changes are required to the modulator and the scan lens to accommodate the shorter wavelength as well as a suitable resist; such changes are within the skill of one of ordinary skill in the art. Photoresists exposed by 200 nm are an active field of investigation with many approaches under consideration; preliminary results have been demonstrated.

As described above, the apparatus of FIG. 1 takes one of at least two embodiments. In the first embodiment the pixels, i.e. the data applied to the electrical port of modulator 46, are synchronous to the pulse rate of the laser. It is to be understood that the pulse rate of the laser is a fixed frequency dependent on the actual laser cavity design and materials. The laser pulses in one embodiment are 50 picoseconds long and have a period of e.g. 13 nanoseconds (ns). (The pulse rate is 50 to 100 MHz.) Of course, this is only exemplary and other wavelengths are possible for the laser as are other pulse lengths and periods (pulse frequencies).

Figure 2:
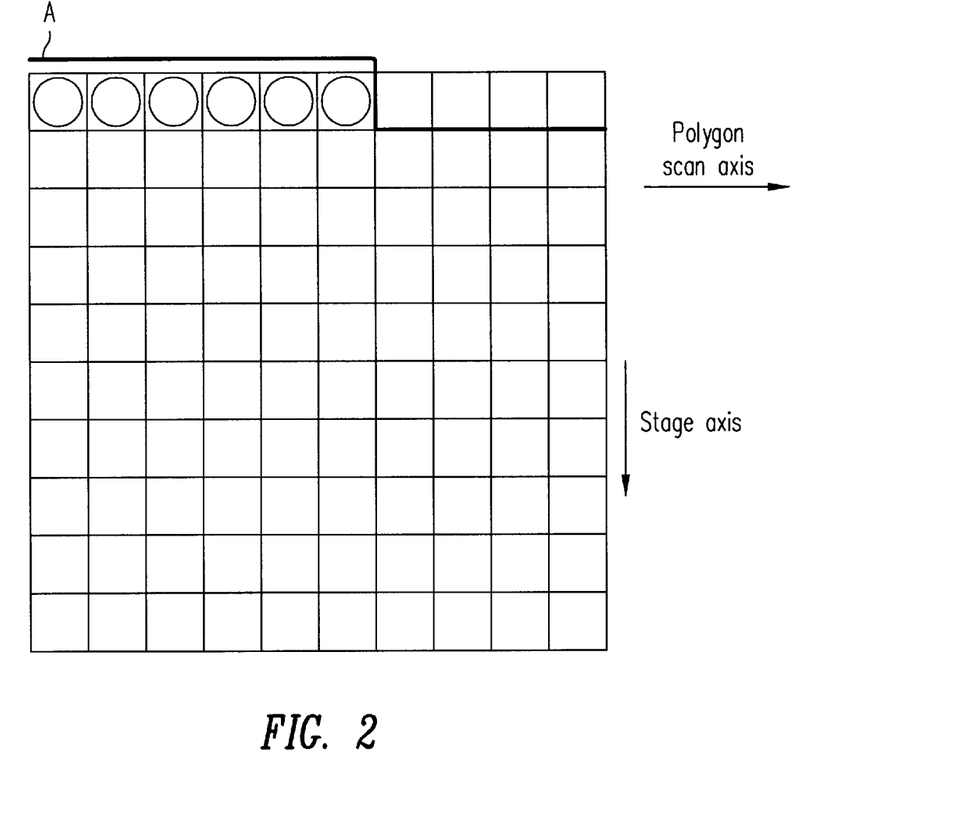
FIG. 2 shows writing of a pattern in a first embodiment of this invention with a synchronous pulsed laser and data.

FIG. 2 shows an example of a pattern scanned by such a synchronous mode laser scanner. The edge position of the feature being written (shown by the circles which are intended to be exposed beam spots or pixels) represents the feature edge position determined by a fixed writing grid and the modulator state, i.e. on, off, grayscale, at the edge pixels. Grayscale (variations in image intensity between on and off) may also be used. In this case, the individual spots, i.e. exposed pixels, are formed in a sequence by laser pulses on the fixed writing grid. The polygon scan axis is the horizontal axis and the stage axis of movement is the vertical axis. The pixels being on or off represent an edge of the feature, shown by line A.

Figure 3:
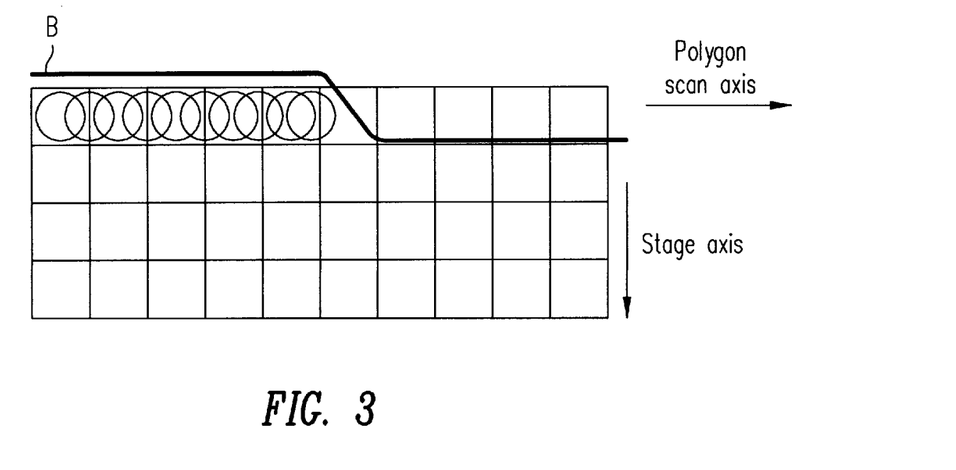
FIG. 3 shows writing of a pattern in a second embodiment of this invention with the pulsed laser not synchronous to the data.

FIG. 3 shows writing in the (second) asynchronous mode embodiment. In this case, the individual pixel spots are not aligned to the writing grid, but are turned off gradually by the modulator 46, in order to achieve the writing pattern shown in FIG. 2. The modulator intensity profile determines the feature edge position, shown by line B. This embodiment also can be used in conjunction with grayscale, but again grayscale is not necessary. Here the laser pulse rate is e.g. 200 MHz.

Figure 4A:
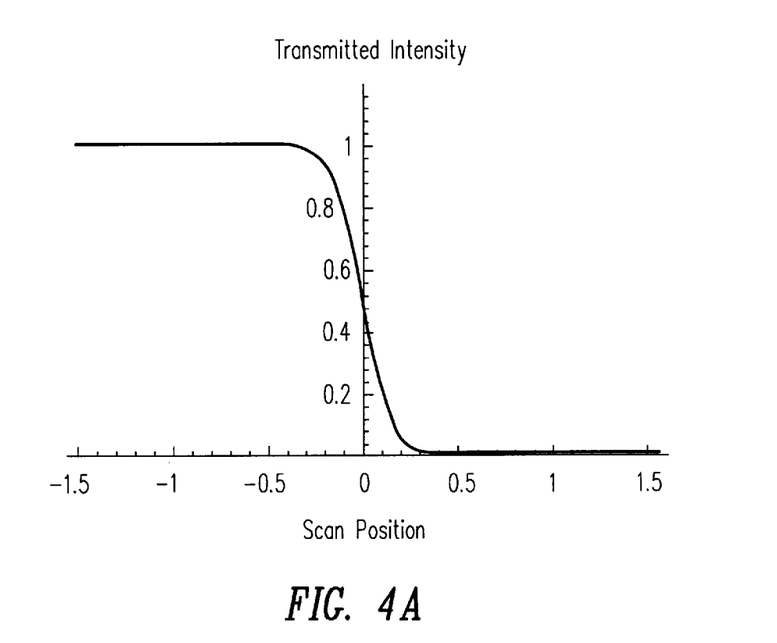
FIGS. 4A and 4B show respectively transmitted intensity and dose verses scan position for the asynchronous embodiment.
Figure 4B:
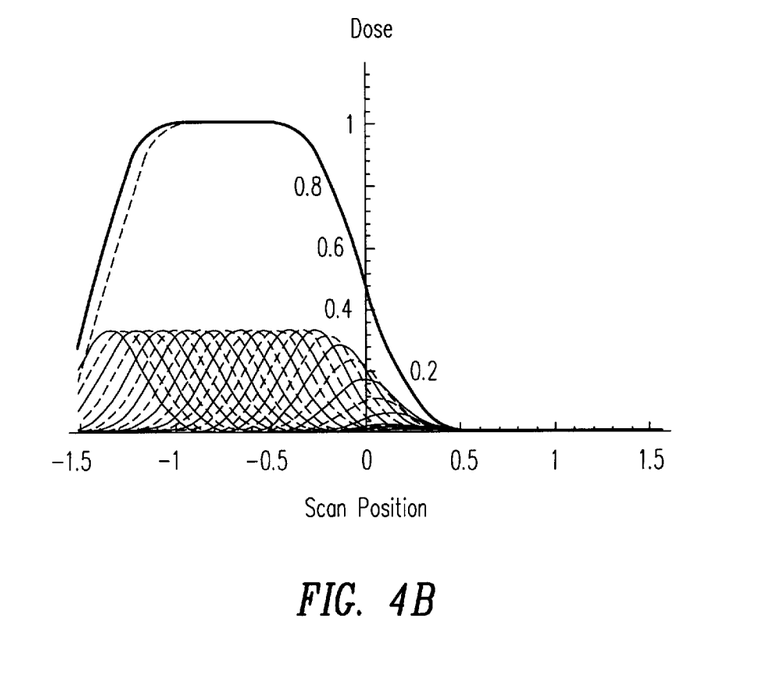

FIGS. 4A and 4B show, respectively, the transmitted intensity versus scan position and the dose versus scan position for the asynchronous mode second embodiment. When the modulation by modulator 46 is applied to a pulse train of scan pixels, in this asynchronous embodiment the edge location of the deposited dose on the workpiece is a function of the modulation wave form position and not the phase of the pulse train. Hence, this writing method is "phase independent".

Figure 5:
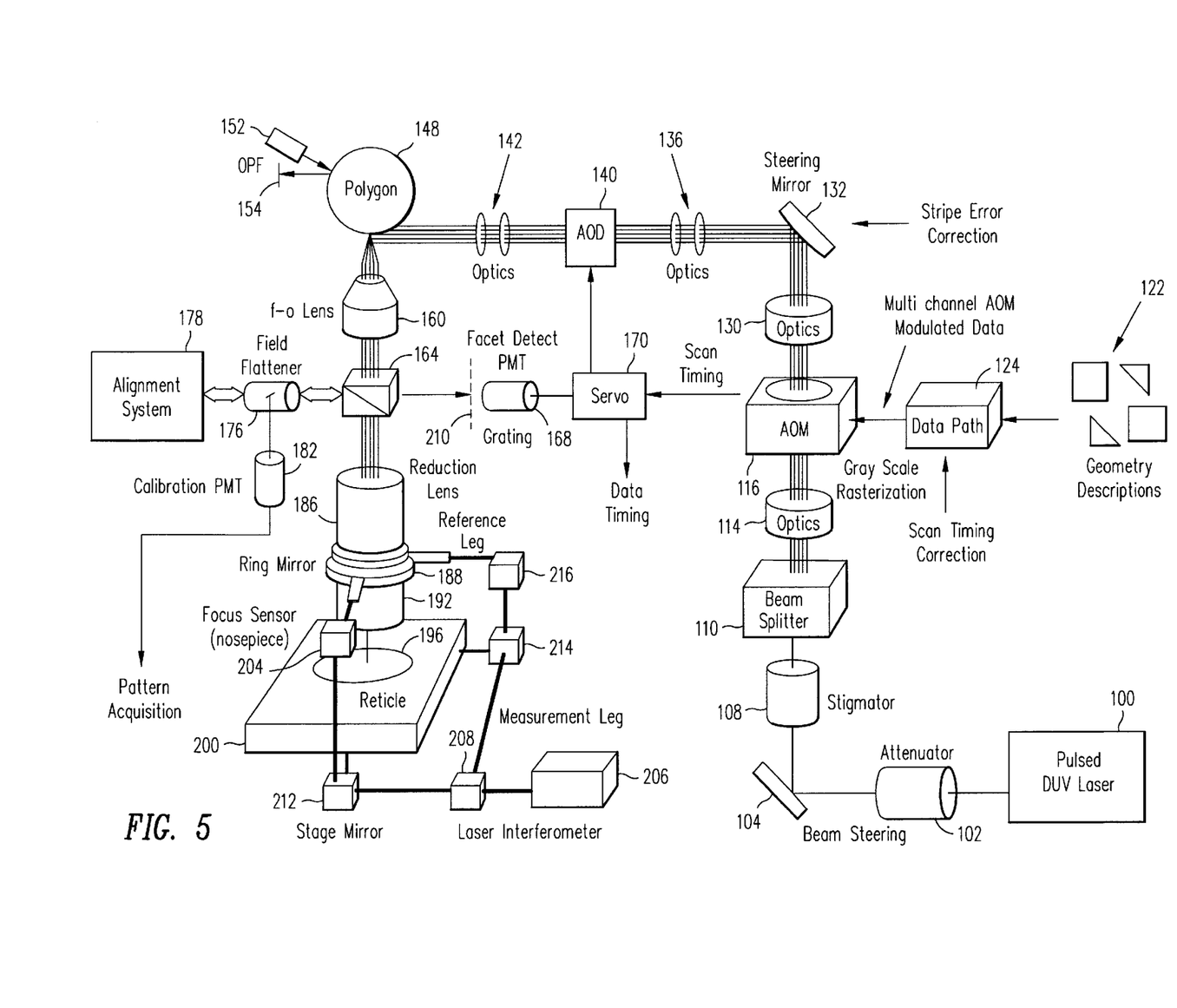
FIG. 5 shows a detailed diagram of a laser scanner in the synchronous embodiment.

FIG. 5 shows a block diagram of a laser scanner in the (first) synchronous mode embodiment. In most respects, this laser scanner is similar to those known in the prior art and referred to above, with the addition of an acousto-optic deflector and associated optics for performing the synchronizing, the accompanying signal processing electronics, and the substitution of a pulsed laser for a nonpulsed (continuous operating) laser. Therefore operation of the apparatus of FIG. 5 is easily understood by one of ordinary skill in the art. Hence the emphasis in the following description is on the novel elements, rather than on the conventional aspects of this apparatus. The apparatus of FIG. 5 has many common elements with that of FIG. 5 of above-referenced U.S. Pat. No. 5,386,221. The apparatus of FIG. 5 is a multi-beam apparatus, e.g. having 32 laser sub-beams in one version to create a "brush" which scans the workpiece (reticle or wafer) by a rotating polygonal mirror. Each beam of the brush is modulated by a multi-channel acousto-optical modulator (AOM). The electrical signals coupled to these channels determine the specific patterns to be generated. This electrical signals are created by a rasterizer.

Pulsed laser 100 provides a laser beam in the ultraviolet (approximately 250 nm wavelength, e.g. 263 and/or 266 nm) as described above. The laser beam is attenuated by attenuator 102 to adjust the power range to the resist exposure requirements and steered by a beam steering apparatus 104, which reduces the need to perform manual alignment of the source laser beam. The stigmator 108, through which the laser beam next passes, insures that the beam is circular by correcting for any elipticity and other astigmatic problems. The corrected beam is then split into e.g. 32 individual sub-beams by beam splitter 110.

The plurality of sub-beams is collectively referred to as the brush. The brush passes through a brush module optics 114 (a relay lens) to re-image and shrink the beams. The brush then enters the acousto-optical modulator (AOM) 116. The AOM modulates the intensity of a laser beam to a level corresponding to one of the grayscale levels, for instance provided by the grayscale rasterization as shown. Electrical signals to drive the AOM are generated as shown beginning with the data which is the geometric descriptions 122 of the patterns (features) to be written. These come for instance from a computer or other source and define the actual patterns which are to be written on the medium, for instance portions of an integrated circuit. These geometric descriptions are supplied to a data path 124 and subject to scan timing correction as described below to provide rasterized data. Therefore multichannel data, in some embodiments including grayscale rasterization, drives the multi-channel AOM 116 (having one channel for each sub-beam).

The modulated brush then passes through a relay optics 130 which causes the sub-beams to converge on a spot on a steering mirror 132. The steering mirror 132 provides for small corrections to the placement of the brush and the stripe axis at the final image plane. The steering mirror 132 alters the angle at which the brush impinges on the polygon mirror 148 in the stripe direction. A stripe correction error factor is also applied to adjust the steering mirror 132.

In accordance with this invention (and not disclosed in the above-referenced U.S. Pat. No. 5,386,221) there is an acousto-optic deflector (AOD) 140 on which the afocal spot on the steering mirror is reimaged by optics 136 and which in turn directs the brush into optics 142. Optics 142 further reimages the afocal spot inside the AOD onto the rotating polygon. The zero-order beam stop is not shown for clarity. Acousto-optic deflector 140 provides the synchronization as described above and in further detail below. Such acousto-optic deflectors are available, for instance, from Newport EOS. The optics 136 and 142 are simple relay lenses, i.e. focussing and defocussing optics, and hence not described in any further detail.

Note that the optics 136 and 142 together perform the function of brush magnification adjustment to adjust the size of the array of sub-beams, i.e. so that they are enlarged and moved farther apart or made smaller and move closer together. The brush is then directed onto the facets of the rotating polygon mirror 148 which has e.g. 24 facets and causes the brush to scan the workpiece along the scan axis. For instance the polygon mirror 148 rotates at a constant rate of 20,000 rpm. The once per facet (OPF) sensor 152 performs polygon synchronization and stage control, as described in above-referenced U.S. Pat. No. 5,386,221, and includes the laser light source 152 and the pickup 154.

The brush reflected from the rotating polygon mirror 148 passes through an f-theta lens assembly 160 which creates an enlarged intermediate image plane, e.g. 33 times the size of the image plane. The reduction lens 186 is located at the other end of the enlarged image plane. The brush exiting the reduction lens 186 is made up of the beams that actually scan the workpiece, illustrated here as a reticle (semiconductor mask) 196.

A beam splitter 164 disposed within the enlarged intermediate image plane is used for two subsystems. One subsystem is an alignment system 178 which captures images of alignment marks on the workpiece using a non-exposing wavelength. The second subsystem is a facet detect photo multiplier tube (PMT) 168. The facet detect PMT 168 is used for the timing of data for each of the facets of the rotating polygon mirror 148. This allows synchronization of the provision of information from the data path 124 to (1) the AOM 116 and (2) to the rotation of the rotating polygon mirror 148. The alignment system 178 is used to detect the position of patterns previously written on the workpiece, so that the pattern to be written can be accurately aligned to the previously written pattern. The pattern alignment system also includes a calibration photo multiplier tube (PMT) 182 providing pattern acquisition data for purposes of machine set-up and adjustment.

Also provided is a conventional laser measurement system (LMS) which includes a ring mirror 188 located on the reduction lens 186. Focus sensor (nose piece) 192 is as described in U.S. Pat. No. 5,087,927, issued Feb. 11, 1992 to Tim Thomas et al., entitled "On-axis Air Gage Focus System." The reticle 196 is located on a stage (not shown) which includes a stage mirror 200. The LMS includes a laser 206 with beam splitters 208, 212, 214 providing beams to measure the relative position of the stage to the reduction lens.

To accomplish the synchronous mode operation of this embodiment, it is necessary to align, in terms of time, the pulses generated by the pulsed laser 100 to a fixed writing grid. It is to be understood that the pulsed laser 100 operates at a fixed pulse frequency and pulse length which cannot readily be varied, being inherent in the construction of the laser. Therefore in accordance with the invention the optical system has been modified by provision of optics 136 and 142 to provide an additional afocal point between the steering mirror 132 and rotating polygon 148, at the location of the acousto-optic deflector 140. The AOD 140 operates due to a change in its drive frequency, i.e. the electrical signal provided to its electrical port, to cause a small angle change to the laser brush when it reaches rotating polygon 148, which in turn corrects a small angle change to the output of the scanner so it can be used to adjust the scan position of the brush to position the laser pulses at predetermined grid locations at the writing surface on reticle 196. This is required to compensate for pointing errors between the polygon 148 facets and to correct for scan position errors in the motion of the stage supporting reticle 196 by timing corrections of the data.

In order to adjust the location of the scanned pulses to the desired location, the position of the pulses is determined by a timing grating 210 located at the start of the scan at the intermediate image plane provided by the beam splitting cube 164. Hence this synchronization occurs once per scan. Grating 210 has a period of twice the distance between laser pulses. One of the 32 beams is turned on by the modulator 116 for a small portion of the scan line at the start of each scan. The radiation transmitted through the beam splitting cube 164 is blocked by a beam stop (not shown) just as in conventional facet detection. The radiation reflected from the hypotenuse of the beam splitting cube 164 is focused on the grating 210.

Figure 6A:
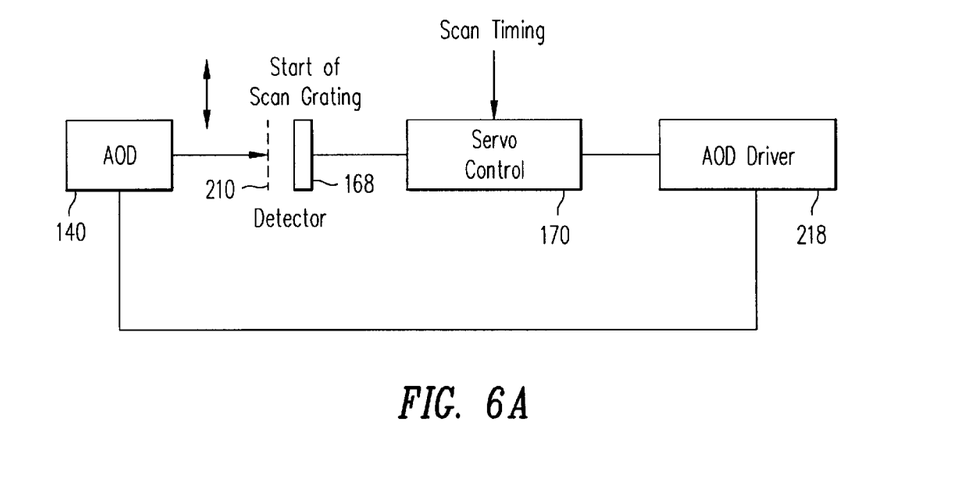
FIGS. 6A and 6B show, respectively, a feedback control loop and the acousto-optic deflector for the synchronous embodiment.

FIG. 6A shows detail of FIG. 5. PMT detector 168 is located behind the grating 210 to generate an electronic signal proportional to the amount of light transmitted through the grating for each laser pulse and provides this signal to servo control 170 which controls AOD driver 218 (shown in FIG. 5 as part of AOD 140). Grating 210 includes in one embodiment a grating part for pulse synchronization and a slit for facet detection; however the grating and slit do not have to be on the same structure.

Figure 6B:
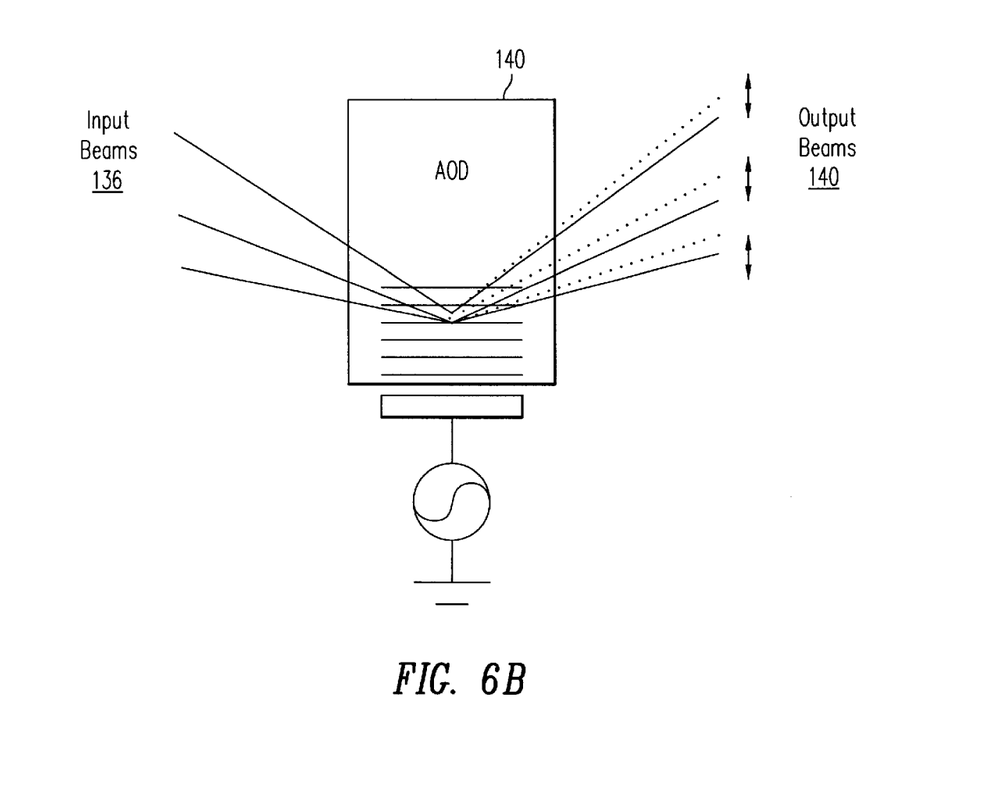

The servo control electronics 170 driving the AOD 140 develops two time averaged signals from respectively the even and odd numbered pulses. The error signal of the servo is the difference between these two signals compared with the timing correction signal. The error signal causes a frequency change in the AOD driver electronics 218 which advances or retards the scanned signal (as shown in FIG. 6B) accordingly until a null condition is reached. At this point the frequency of the AOD 140 is locked until the facet detect signal is received. This signal for the start of data can be obtained from a slit located after an opaque region of the grating 210 and an appropriate grating delay.

Figure 7A:
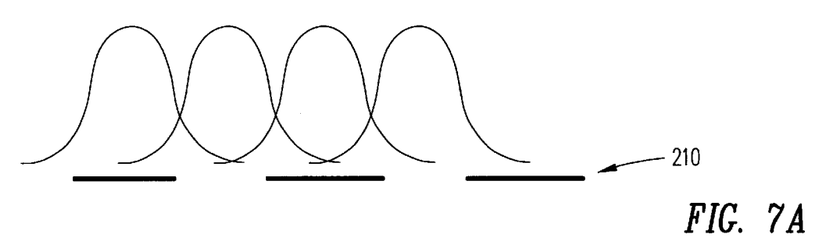
FIGS. 7A–7D show a method for detecting the position of laser pulses in the synchronous embodiment.
Figure 7B:
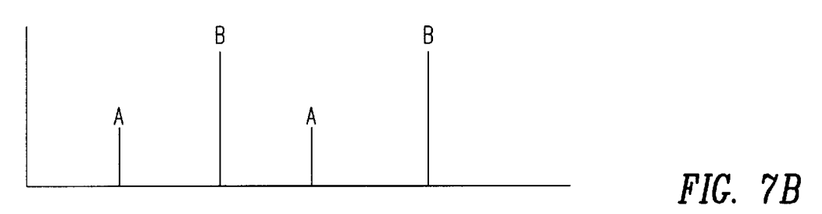
Figure 7C:
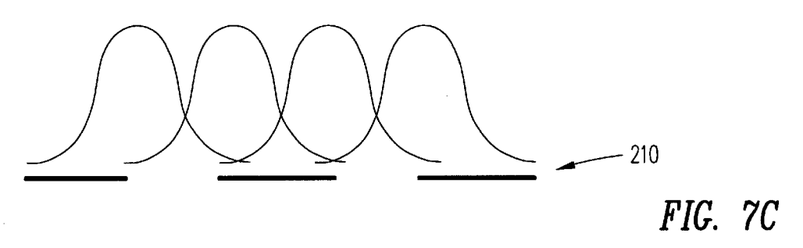
Figure 7D:
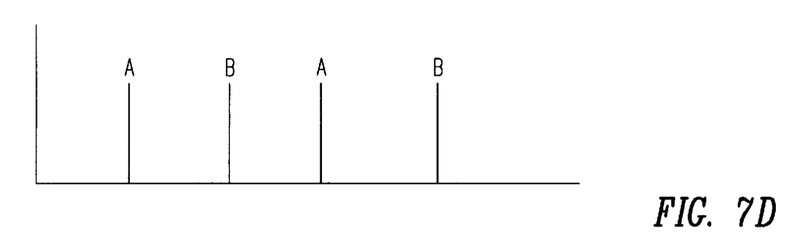

This is better understood with reference to FIGS. 7A to 7D. FIG. 7A shows the beams (the curves) incident on grating 210, with the resulting detected odd/even signal strengths A, B at detector 168 being shown graphically in FIG. 7B. FIG. 7C shows the beams, shifted in phase by 180°, incident on grating 210 and the resulting detector 168 signal strengths A/B in FIG. 7D; when signals A and B are equal (FIG. 7D), the desired phase adjustment has been accomplished to achieve synchronization for no timing correction. To compensate for scan axis stage errors, a non-zero timing correction may be introduced to set the appropriate phase after facet detect. Thus the signal from a pulsed spot strobed on the facet detect slit in grating 210 together with the phase adjustment from the grating servo give a signal representing the true position of the laser beam, independent of the timing of the laser beam pulses. An appropriate data delay is introduced along with the phase setting to place the pulsed beam at the correct location on the workpiece at the correct time. (This is used in the synchronous embodiment.)

Any imbalance in the A and B pulse amplitudes causes a 77 MHz/2=38.5 MHz frequency component to appear at the PMT 168 output. If one senses the amplitude of this frequency, one can determine whether the A amplitude equals the B amplitude, but cannot tell which is bigger. If one synchronously demodulates the 38.5 MHz, one will have a DC output which is a function both of the amplitude and phase of the signal. This makes it possible to know whether A or B is larger, and by how much. To make this work, the phase of the reference signal is made adjustable. This is easily done.

Figure 8:
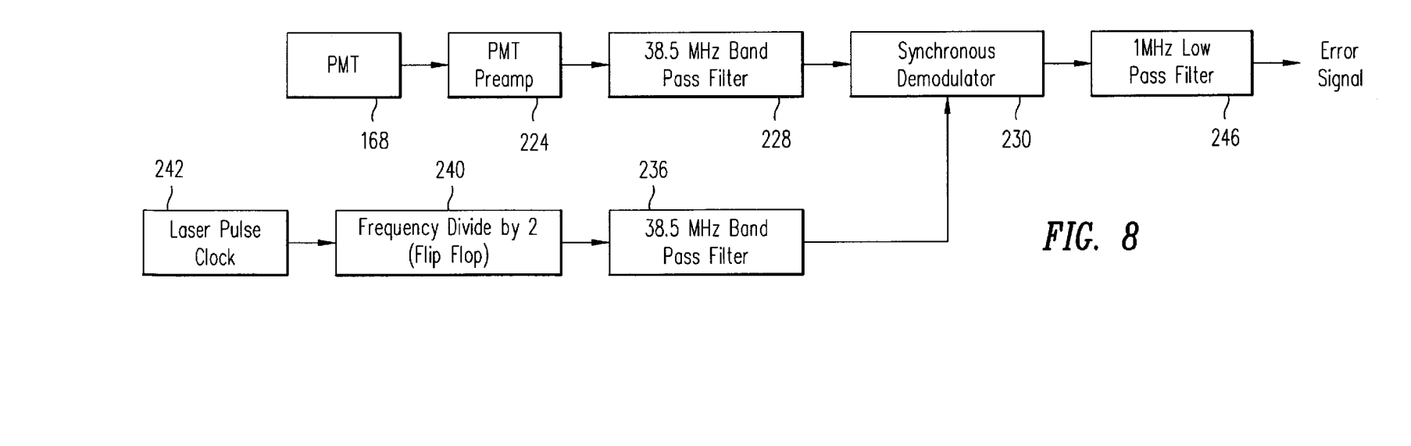
FIG. 8 shows a block diagram of a pulse position detector and control circuit for the synchronous embodiment.

FIG. 8 shows a detailed block diagram of servo control electronics 170 (for the synchronous embodiment). PMT (photomultiplier tube) 168 provides its output signal to a preamplifier 224 which drives a 38.5 MHz bandpass filter 228, the output signal of which is coupled to a synchronous demodulator 230. The other input port of synchronous demodulator 230 is coupled to a second 38.5 MHz BDF 236, driven in turn by the clock pulse 242 from laser 100 divided by two by e.g. flip-flop 240. Demodulator 230 drives 1 MHz low pass filter 246 which outputs an error signal to AOD driver 218 of FIG. 6A.

This approach is practical because of the rapid response available from AODs, especially with the small number of resolvable spots required for this application. For a single beam system, N, the total number of resolvable spots the AOD 140 is designed to is:

$$N=N_D,$$

where $N_D$ is the number of spots of deflection required to shift by one writing grid unit plus some margin, about 5. For a multiple beam system with beams spread out largely in the scan direction:

$$N = N_D + N_A,$$

where $N_A$ is the number of spots in the array of scanned spots or "brush" of the system, e.g. 102 spots in one version. The reason for this additional term is to allow for meeting the Bragg angle tolerance on the input to the AOD. The configuration of the AOD 140 and the array of beams is shown in FIG. 6B.

$N_A$ is given by:

$$N_A = (4/\pi) D_A / d_{1/e2},$$

where $D_A$ is the length of the array inside the multi-transducer AOM 116 and $d_{1/e2}$ is the $1/e^2$ diameter of each of the beams inside the AOM 116. (The factor $4/\pi$ comes about from measuring a resolved spot at the 40% intensity point rather than the $1/e^2$ intensity point.) The total number of resolved spots, N, determines the AOD 140 configuration and the preparation of the input beams. In particular the input beam diameter must be made big enough, and therefore the angular spread of the array small enough, so the total angular input plus any deflection angle falls within the Bragg angle acceptance tolerance. An N of 110 is sufficient. For AODs the equation relating the acoustic transit time, t, for such a properly prepared input, the total frequency bandwidth, $\Delta F$, and N, the number of resolvable spots is:

$$t = N/\Delta F.$$

AOD devices are commercially available with 110 MHz bandwidth giving a transit time of 1 $\mu$s. A typical facet period of polygon 148 is 125 $\mu$s. A laser pulse period of e.g. 10 to 20 ns gives 50 to 100 samples per transit time, adequate to prepare an averaged error signal from the grating 210. Devoting 10 $\mu$s of the scan period for grating synchronization allows 10 servo loop time constants for equilibrium to be established.

Figure 9:
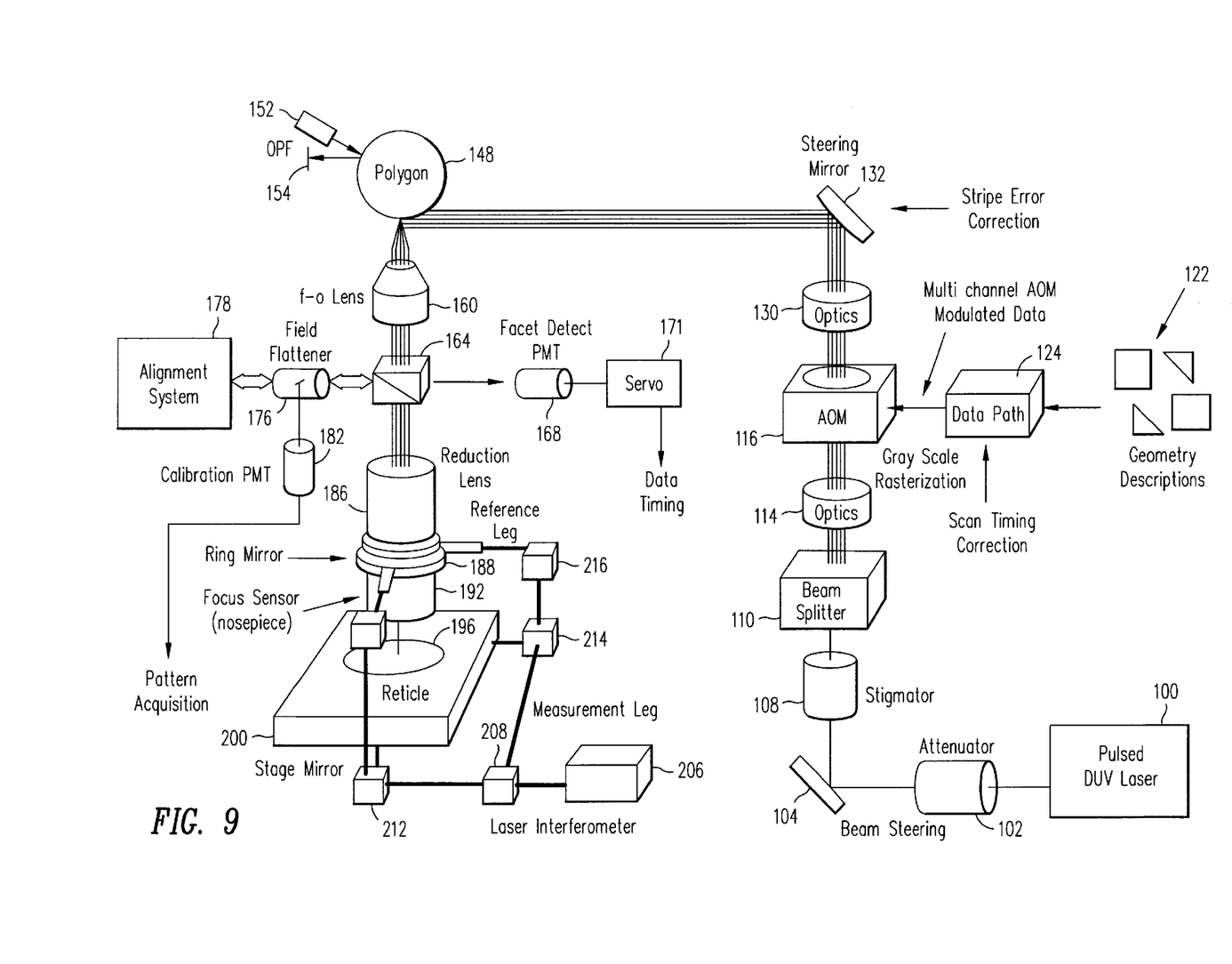
FIG. 9 shows a detailed block diagram of a laser scanner in the asynchronous embodiment.

FIG. 9 shows a detailed block diagram of the asynchronous (second) mode embodiment. Most of the elements are identical to those of FIG. 5 and are identically labeled. In one embodiment, magnification adjustment optics (not shown) are located intermediate steering mirror 132 and polygon 148. There is no AOD or AOD driver or AOD grating; hence filter block 171 differs from and is simpler than servo block 170 of FIG. 5 and is for purposes of facet detection only, as described below.

The present inventors have found that two challenges of the asynchronous embodiment are first keeping the edge location of a printed feature invariant to changes in laser pulse phase and second, detecting the scanned beam at facet detect in such a way that its measured position is also independent of the laser pulse phase.

The formation of an edge can be modeled mathematically as follows:

A pulsed laser scanning system scans a pulsed Gaussian shaped laser beam across the writing surface. For pulses that are short compared to the pixel dwell time, the pulses can be treated as infinitesimally short. This writing beam is turned on or off by the acousto-optic modulator 116 (AOM). As the sound wave inside the AOM 116 propagates across the beam, the intensity of the pulses is modulated by an error function profile. The integrated intensity or dose on the writing surface is given by I(x,dn) below, where n is an integer, dn is a phase variable between 0 and 1, a is the distance beam scans between laser pulses, r is the $1/e^2$ radius of the Gaussian beam, and $d_{off}$ is the distance the beam scans during the time sound travels across the $1/e^2$ diameter of the spot inside the AOM.

The phase variable, dn, sets the phase of the laser pulses with respect to the modulation function. $I_0$ is a normalization constant chosen to give I(x,dn) a value of 1 for a scanned beam with no modulation, under conditions which lead to a smooth intensity profile. This formula applies to an edge where the AOM is half turned off at x=0.

$$I(x, dn) = \frac{1}{2I_0} \sum_{n=-\infty}^{\infty} e^{\frac{-2(x-(n+dn)a)^2}{r^2}} \left(1 - erf\left(\frac{\sqrt{2}(n + dn)a}{d_{off}}\right)\right)$$

where $$I_0 = \sum_{n=-\infty}^{\infty} e^{\frac{-2(na)^2}{r^2}}$$

For suitably selected parameters it can be shown that the edge location is in fact invariant to the phase variable dn. This is illustrated in FIG. 4B.

The signal generated from a pulsed laser traversing the facet detection slit can likewise be modeled mathematically.

A facet detect pulse, or start of scan signal, is generated by scanning the pulsed Gaussian beam across the narrow facet detection slit (not shown) provided e.g. in grating 210 with the PMT detector 168 located behind the slit. This can be done at an intermediate image plane at a higher magnification. If the detector response is Gaussian to the short pulses of light from the laser or if appropriate electronic filtering (described below) is performed on the output signal from the detector 168 to give a Guassian response, the integrated signal, or voltage, from the pulses is given by S(x,dn) below. This signal is calculated as a function of position of the beam at the writing substrate.

Any constant delays introduced by the detector 168 or the subsequent filtering are of no importance and are neglected. The integer variable n, the phase variable dn, and the distance scanned between laser pulses a, are the same as above. A new constant, w, is defined as the $1/e^2$ pulse radius, in distance scanned, caused by the laser pulse width, the detector response, and any electronic filtering performed on the detector. $S_0$ is a normalizing constant chosen to make S(x,dn)=1 at x and dn=0. The coordinates are chosen so that the peak signal occurs at x=0 for smooth integrated signals:

$$S(x, dn) = \frac{1}{S_0} \sum_{n=-\infty}^{\infty} e^{\frac{-2((n+dn)a)^2}{r^2}} e^{\frac{-2(x-(n+dn)a)^2}{w^2}}$$

where $$S_0 = \sum_{n=-\infty}^{\infty} e^{\frac{-2(na)^2}{r^2}} e^{\frac{-2(na)^2}{w^2}}$$

Figure 10A:
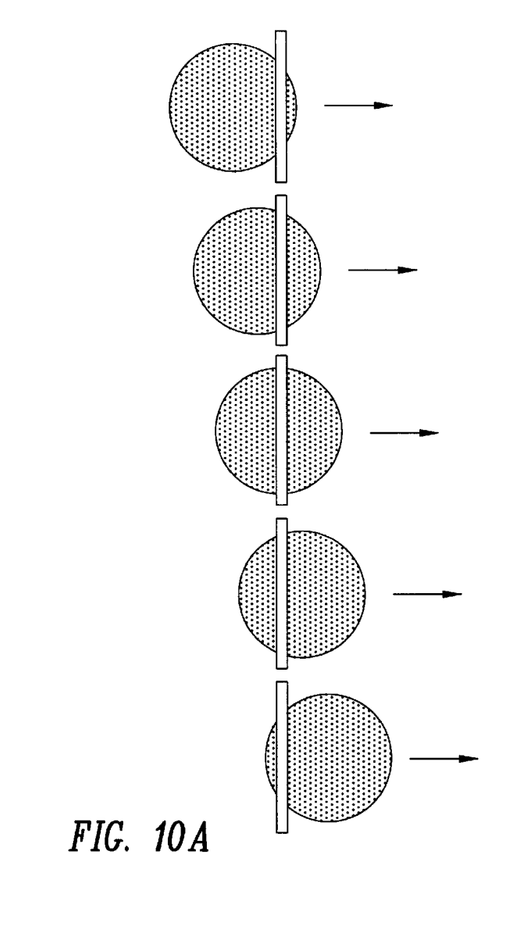
FIGS. 10A and 10B show, respectively, facet detection and facet detection response for the asynchronous embodiment.
Figure 10B:
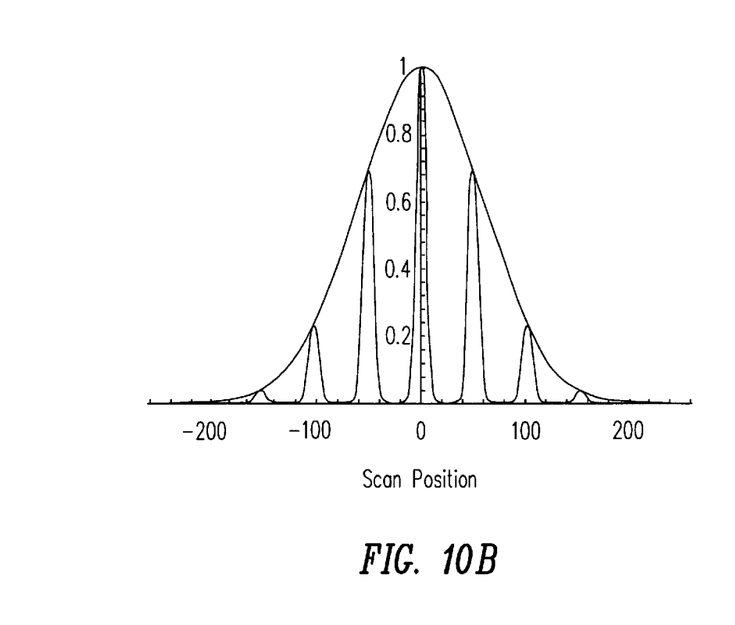
Figure 11A:
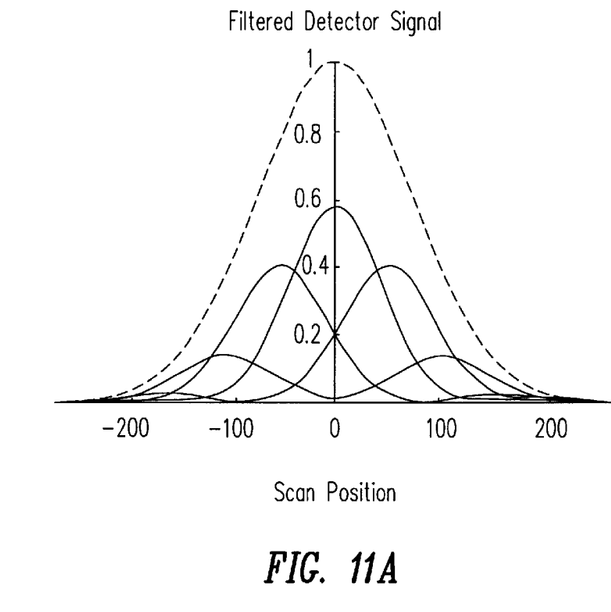
FIGS. 11A and 11B together show the phase independence of the filtered facet detect signal.
Figure 11B:
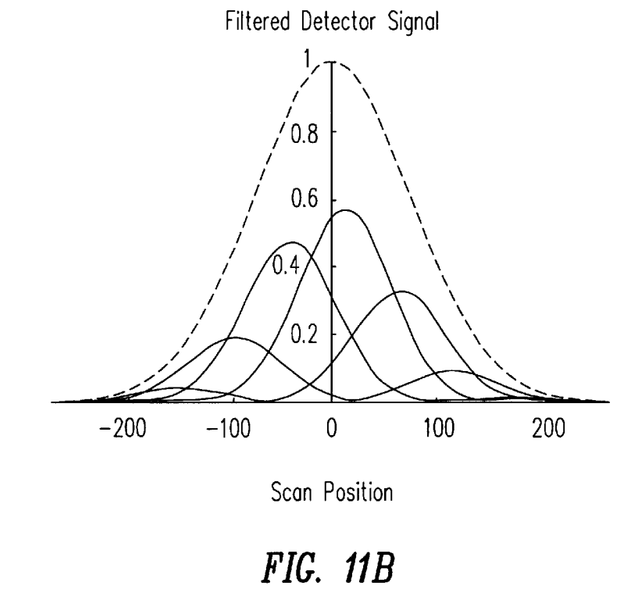

For suitably selected parameters it can be shown that the filtered signal position is independent of phase variable dn. This is shown in FIGS. 10A, 10B and 11A, 11B. FIG. 10A shows a round laser beam traversing the rectangular narrow facet detection slit. FIG. 10B shows the resulting unfiltered electronic signal from the pulses under an envelope of what would be the signal if the laser were operating in a CW mode; the vertical scale in FIG. 10B is amplitude and the horizontal scale is scan position. FIGS. 11A and 11B show graphically the response of the facet detector in terms of the broadened pulses from the above-described electronic filtering carried out by filter circuitry 171 of FIG. 9 and the sum of the signals (dotted line) from the individual pulses for two different arbitrarily chosen phases. Comparing FIG. 11A to FIG. 11B shows that the sum is independent of pulse phase.

In this asynchronous embodiment, the variable phase differences between the laser pulses and the data pixel clock signals are accommodated by appropriate choice of system parameters, of which a range have been found to be appropriate. One exemplary version for a 263 nm wavelength laser beam uses a pixel size of 160 nm, a spot size ($1/e^2$) of 320 nm, an AOM spot size ($1/e^2$) of 144 nm, a pixel period of 20 ns, and a laser period of 13 ns. Then it is found that the distance the beam scans between laser pulses is 104 nm, the $1/e^2$ radius of the image spot is 160 nm, and the distance the beam scans during the time the acoustic signal travels across the $1/e^2$ diameter of the spot inside the AOM is 192 nm. Such a system has been found to write a phase independent pattern on the workpiece, with negligible errors, without laser pulse-to-data synchronization, and using commercially available system components.

Moreover, in the asynchronous embodiment it has been found to be satisfactory, in spite of the pulsing of the laser beam, to use several stages of a low pass filter network to broaden and make Gaussian the output signal from the facet detector PMT 168, to achieve facet detection of the pulsed laser beam. For example, four series-connected low pass filter stages each having an RC time constant of 15 ns coupled to receive the output signal of PMT 168 provide sufficient signal smoothing for facet detection; this is filter circuitry 171 shown in FIG. 9. The filtering of the facet detector PMT 168 output signal thereby allows facet detection in the asynchronous embodiment.

This disclosure is illustrative and not limiting; further modifications will be apparent to one skilled in the art in light of this disclosure, and are intended to fall within the scope of the appended claims.

What is claimed:

1. A laser pattern generator comprising:
   a pulsed laser generating a pulsed laser beam;
   an acousto-optic modulator located to receive the pulsed beam and modulate the pulsed beam with an electrical signal defining the pattern;
   a scanner located to receive the modulated pulsed beam from the modulator and scan the modulated beam across a medium;
   a scan lens intermediate the scanner and the medium to focus the beam on the medium;
   a deflector in a path of the beam between the modulator and the scanner to deflect the beam;
   a detector to detect the beam; and
   a control circuit coupled to the deflector and to the detector to deflect the beam synchronously with the detected pulses of the beam.

2. The laser pattern generator of claim 1, wherein the laser is pulsed at a frequency of at least 1 MHz.

3. The laser pattern generator of claim 1, wherein the scanner includes a rotating polygon having a plurality of reflective facets.

4. The laser pattern generator of claim 1, wherein the scanner includes an acousto-optical deflector which synchronizes the scanner to the pulsed beam.

5. The laser pattern generator of claim 1, wherein a diameter of the beam incident on the medium is less than 400 nm.

6. The laser pattern generator of claim 1, wherein the laser is a frequency quadrupled solid state laser.

7. The laser pattern generator of claim 1, wherein the electrical signal represents a grayscale pattern to be written on the medium.

8. The laser pattern generator of claim 1, wherein a rise time of the modulator is less than a pulse period of the beam.

9. The laser pattern generator of claim 1, wherein the laser beam is at a wavelength of less than or equal to 355 nm when output from the laser.

10. A laser pattern generator comprising:
    a pulsed laser generating a pulsed laser beam;
    an acousto-optic modulator located to receive the pulsed beam and modulate the pulsed beam with an electrical signal defining the pattern;
    a scanner located to receive the modulated pulsed beam from the modulator and scan the modulated beam across a medium wherein a pulse rate of the laser is equal to or greater than a pixel rate of pixels of the pattern, and wherein the pulse rate of the laser is asynchronous to the modulation of the pulsed beam, whereby a pattern defined on the medium by the beam is not aligned to any fixed grid defined on a surface of the medium.

11. The laser pattern generator of claim 10, wherein a phase of a pulse rate of the pulsed laser is independent of a modulation frequency of the electrical signal.

12. The laser pattern generator of claim 10, wherein the pulsed laser beam is at a wavelength of less than or equal to 355 nm when output from the pulsed laser.

13. A laser pattern generator comprising:
    a pulsed laser generating a pulsed laser beam;
    an acousto-optic modulator located to receive the pulsed beam and modulate the pulsed beam with an electrical signal defining the pattern;
    a scanner located to receive the modulated pulsed beam from the modulator and scan the modulated beam across a medium wherein the scanner includes a rotating polygon having a plurality of reflective facets;
    a slit located to receive the pulsed laser beam reflected from the rotating polygon;
    a detector located behind the slit; and
    a filter coupled to the detector, to provide a broadened signal indicating a location of the facets of the rotating polygon.

14. The laser pattern generator of claim 13, wherein the pulsed laser beam is at a wavelength of less than or equal to 355 nm when output from the pulsed laser.

15. A method of imaging a plurality of pixels on a medium with a laser beam, comprising:
    outputting a laser beam from a pulsed laser; modulating the pulsed laser beam with an electrical signal defining the pixels;
    scanning the modulated beam across the medium;
    focusing the scanned beam on the medium;
    detecting the pulses of the beam; and
    deflecting the beam synchronously with the pulses of the beam.

16. The method of claim 15, wherein the laser beam is pulsed at a frequency of at least 1 MHz.

17. The method of claim 15, wherein the scanning includes rotating a polygon having a plurality of reflective facets.

18. The method of claim 15, wherein the scanning includes acousto-optical deflecting to synchronize the scanning to the pulsed beam.

19. The method of claim 15, wherein a diameter of the beam incident on the medium is less than 400 nm.

20. The method of claim 15, further comprising generating the laser beam from a frequency quadrupled solid state laser.

21. The method of claim 15, wherein the electrical signal represents a grayscale pattern to be written on the medium.

22. The method of a modulator in claim 15, wherein a rise time of the step of modulating is less than a pulse period of the beam.

23. The method of claim 15, wherein the laser beam is at a wavelength of less than or equal to 355 nm when output from the pulsed laser.

24. A method of imaging a plurality of pixels on a medium with a laser beam, comprising:

outputting a laser beam from a pulsed laser;

modulating the pulsed laser beam with an electrical signal defining the pixels;

scanning the modulated beam across the medium;

focusing the scanned beam on the medium, and, wherein a pulse rate of the laser beam is equal to or greater than a pixel rate of the pixels.

25. The method of claim 24, wherein a phase of the pulse rate of the pulsed laser beam is independent of a modulation frequency of the electrical signal.

26. The method of claim 24, wherein the laser beam is at a wavelength of less than or equal to 355 nm when output from the pulsed laser.

27. A method of imaging a plurality of pixels on a medium with a laser beam, comprising:

outputting a laser beam from a pulsed laser;

modulating the pulsed laser beam with an electrical signal defining the pixels;

scanning the modulated beam across the medium;

focusing the scanned beam on the medium, wherein a rise time a modulator in of the step of modulating is equal to or greater than a pixel period of the pixels.

28. A method of imaging a plurality of pixels on a medium with a laser beam, comprising:

outputting a laser beam from a pulsed laser;

modulating the pulsed laser beam with an electrical signal defining the pixels;

scanning the modulated beam across the medium;

focusing the scanned beam on the medium;

wherein the scanning includes rotating a polygon having a plurality of reflective facets;

passing the pulses of the beam reflected from the facets of the polygon through a slit;

detecting the pulses after passing through the slit; and filtering the detected pulses to provide a broadened output signal, thereby to indicate a location of the facets of the polygon.

* * * * *